United States Patent
Yang et al.

(10) Patent No.: US 8,629,565 B2
(45) Date of Patent: Jan. 14, 2014

(54) THIN WAFER PROTECTION DEVICE

(75) Inventors: Ku-Feng Yang, Dali (TW); Weng-Jin Wu, Hsinchu (TW); Wen-Chih Chiou, Toufen (TW); Tsung-Ding Wang, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 134 days.

(21) Appl. No.: 13/419,078

(22) Filed: Mar. 13, 2012

(65) Prior Publication Data

US 2012/0168962 A1 Jul. 5, 2012

Related U.S. Application Data

(63) Continuation of application No. 12/731,281, filed on Mar. 25, 2010, now Pat. No. 8,232,140.

(60) Provisional application No. 61/164,092, filed on Mar. 27, 2009.

(51) Int. Cl.
*H01L 23/52* (2006.01)
*H01L 23/48* (2006.01)
*H01L 29/40* (2006.01)

(52) U.S. Cl.
USPC .................. 257/777; 257/E25.013; 257/686; 438/108; 438/109

(58) Field of Classification Search
USPC ............... 257/E21.502, E23.067, E23.117, 257/E23.116, E25.013, 685, 686, 723, 737, 257/774, 78, 777, 8; 438/106–110, 112, 438/114, 124–127; 361/760
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,547,906 A * | 8/1996 | Badehi .......................... 438/109 |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,344,401 B1 * | 2/2002 | Lam .............................. 438/460 |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,784,023 B2 | 8/2004 | Ball |
| 6,800,930 B2 | 10/2004 | Jackson et al. |

(Continued)

*Primary Examiner* — Chris Chu
(74) *Attorney, Agent, or Firm* — Lowe Hauptman & Ham, LLP

(57) ABSTRACT

A thin wafer protection device includes a wafer having a plurality of semiconductor chips. The wafer has a first side and an opposite second side. A plurality of dies is over the first side of the wafer, and at least one of the plurality of dies is bonded to at least one of the plurality of semiconductor chips. A wafer carrier is over the second side of the wafer. An encapsulating layer is over the first side of the wafer and the plurality of dies, and the encapsulating layer has a planar top surface. An adhesive tape is over the planar top surface of the encapsulating layer.

20 Claims, 6 Drawing Sheets

(56) References Cited

U.S. PATENT DOCUMENTS

| | | | | |
|---|---|---|---|---|
| 6,841,883 | B1 | 1/2005 | Farnworth et al. | |
| 6,882,030 | B2 | 4/2005 | Siniaguine | |
| 6,924,551 | B2 | 8/2005 | Rumer et al. | |
| 6,962,867 | B2 | 11/2005 | Jackson et al. | |
| 6,962,872 | B2 | 11/2005 | Chudzik et al. | |
| 7,030,481 | B2 | 4/2006 | Chudzik et al. | |
| 7,049,170 | B2 | 5/2006 | Savastiouk et al. | |
| 7,060,601 | B2 | 6/2006 | Savastiouk et al. | |
| 7,071,546 | B2 | 7/2006 | Fey et al. | |
| 7,087,502 | B2 | 8/2006 | Priewasser et al. | |
| 7,111,149 | B2 | 9/2006 | Eilert | |
| 7,122,912 | B2 | 10/2006 | Matsui | |
| 7,129,118 | B2 * | 10/2006 | Yoo et al. | 438/113 |
| 7,157,787 | B2 | 1/2007 | Kim et al. | |
| 7,193,308 | B2 | 3/2007 | Matsui | |
| 7,217,595 | B2 | 5/2007 | Morrow et al. | |
| 7,262,495 | B2 | 8/2007 | Chen et al. | |
| 7,295,029 | B2 | 11/2007 | Zhao | |
| 7,297,574 | B2 | 11/2007 | Thomas et al. | |
| 7,335,972 | B2 | 2/2008 | Chanchani | |
| 7,355,273 | B2 | 4/2008 | Jackson et al. | |
| 7,371,612 | B2 * | 5/2008 | Ball | 438/113 |
| 7,372,140 | B2 * | 5/2008 | Lee | 257/686 |
| 7,416,919 | B2 | 8/2008 | Chou | |
| 7,473,581 | B2 * | 1/2009 | Tao | 438/109 |
| 7,508,059 | B2 | 3/2009 | Lin et al. | |
| 7,648,889 | B2 * | 1/2010 | Sekiya | 438/458 |
| 7,662,666 | B2 * | 2/2010 | Kondo | 438/109 |
| 7,807,505 | B2 * | 10/2010 | Farnworth et al. | 438/113 |
| 7,863,092 | B1 | 1/2011 | Chaware et al. | |
| 7,883,991 | B1 * | 2/2011 | Wu et al. | 438/459 |
| 7,994,026 | B2 | 8/2011 | Harikai et al. | |
| 8,017,439 | B2 | 9/2011 | Takahashi et al. | |

\* cited by examiner

THIN WAFER PROTECTION DEVICE

CROSS-REFERENCE TO RELATED APPLICATIONS

The present application is a continuation of U.S. application Ser. No. 12/731,281, filed Mar. 25, 2010, which claims priority of U.S. Provisional Patent Application Ser. No. 61/164,092 filed on Mar. 27, 2009, which are incorporated herein by reference in their entireties.

BACKGROUND

The present invention relates generally to wafer handling and processing, and more particularly to a thin wafer protection device.

In the semiconductor industry, efforts to reduce the thickness of a semiconductor wafer are in progress to respond to the goals of reducing the thickness of semiconductor packages, to increase the chip speed, and for enabling high-density fabrication. However, with thinned dimensions, these ultra thin wafers are too fragile to reliably handle or manipulate during process steps, such as dicing the wafer into individual chip packages. They have insufficient strength and are more susceptible to cracking and deformation, such as bending and/or warping. One way of handling the ultra thin wafer is to encapsulate it in a molding compound, such as thermocuring epoxy resin.

However, encapsulating an ultra thin wafer in a molding compound during handling and processing is not without its drawbacks. Where the molding compound has become undone or delaminated from the wafer to which it is attached to, the wafer may be subject to warpage. Wafer warpage is detrimental to the fabrication process and tends to decrease the overall process yield and may degrade the quality and reliability of the chip packages that are produced. Moreover, where molding delamination from the wafer has occurred, the edges of the wafer may be more susceptible to cracking, chipping, and/or corrosive environmental influences during the subsequent dicing process and associated handling. In stacked chips, heat becomes an issue. Molding compounds generally accumulate an excessive amount of heat, which then impacts device performance.

For these reasons and other reasons that will become apparent upon reading the following detailed description, there is a need for an improved method of handling and processing ultra thin wafers that avoids the shortcomings of conventional methods.

BRIEF DESCRIPTION OF THE DRAWINGS

The features, aspects, and advantages of the present invention will become more fully apparent from the following detailed description, appended claims, and accompanying drawings in which:

FIGS. 1A-6A are cross-sectional views depicting a semiconductor device undergoing various stages of fabrication according to one embodiment of the present invention.

FIGS. 1B-6B are cross-sectional views depicting a semiconductor device undergoing various fabrication stages according to another embodiment of the present invention.

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1A:
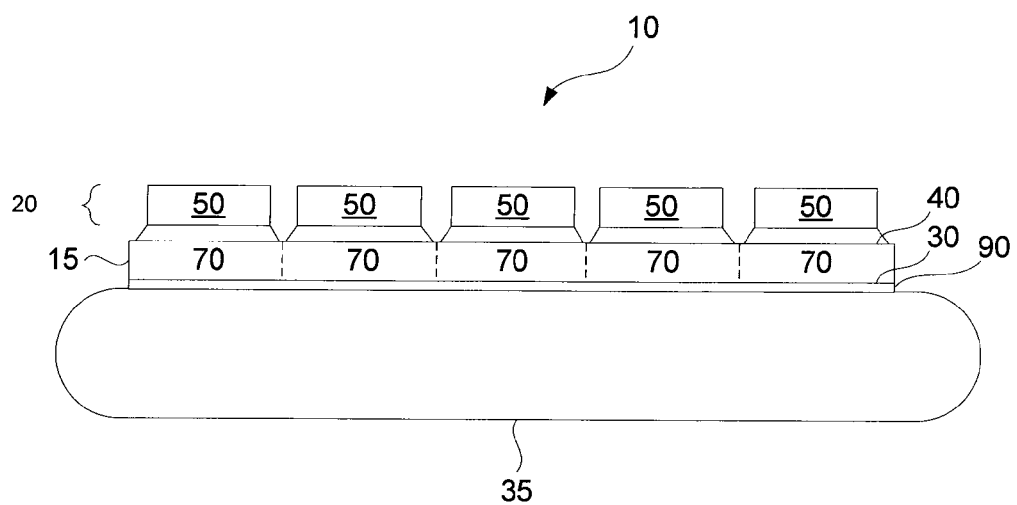

FIGS. 1A-6A are cross-sectional views depicting a semiconductor device undergoing various stages of fabrication according to one embodiment of the present invention. FIG. 1A shows a cross-sectional view of an integrated circuit structure 10. Integrated circuit structure 10 includes a wafer 15 having a plurality of semiconductor chips 70. Wafer 15 has a front surface 30 and a back surface 40, wherein bond pads (not shown) and/or other interconnect structures (not shown) are close to the front surface 30, while one or more through-silicon-vias (TSVs) (not shown) extend to the back surface 40. Redistribution layers (RDLs) (not shown) may be formed on the back surface 40 before bond pads are formed for die attachment. Integrated circuits (not shown) including active and passive devices such as transistors, resistors, capacitors, and the like, are formed at the front surface 30 of wafer 15.

Wafer 15 includes semiconductor wafers such as silicon, gallium arsenide, a rock crystal wafer, sapphire, glass, and the like. Semiconductor chips 70 may include memory chips, RF (radio frequency) chips, logic chips, or other chips. Dies 20 are bonded to the back surface 40 of wafer 15. Dies 20 may include memory chips, RF chips, logic chips, or other chips. Each of the dies 20 includes semiconductor substrate 50. At least one of dies 20 is bonded to at least one of the plurality of semiconductor chips 70. So, for example, one die 20 may be bonded to two or more chips 70. Alternatively, one semiconductor chip 70 may have more than one die 20 bonded thereon. The dies 20 bonded onto a same semiconductor chip 70 may have the same or different circuit design and/or sizes.

Preferably, dies 20 and chips 70 are bonded fact-to-back, wherein the bonding methods include commonly used methods such as die bonding, solder bumping, oxide-to-oxide bonding, oxide-to-silicon bonding, copper-to-copper bonding, adhesive bonding, fusion bonding via oxide-to-oxide bond, bonding by a glue medium such as benzocyclobutene (BCB), and the like. One or more through-silicon vias (TSVs) (not shown) may extend from wafer 15 to dies 20 to make electrical connection therebetween.

Also shown in FIG. 1A is a wafer carrier 35 attached to the front surface 30 of wafer 15 by an adhesive layer 90. Wafer carrier 35 acts as a temporary support substrate or carrier to facilitate wafer handling, transport, and processing. Wafer carrier 35 can be a silicon substrate, glass substrate, polymer substrate, polymer-based composite substrate, or thick tape and may be attached to the front surface 30 of wafer 15 by, for example adhesive bonding, tape bonding, or resin bonding. Wafer carrier 35 is preferably rigid as a rigid carrier helps to reduce wafer warping and prevents wafer breakage during handling and processing.

Figure 2A:
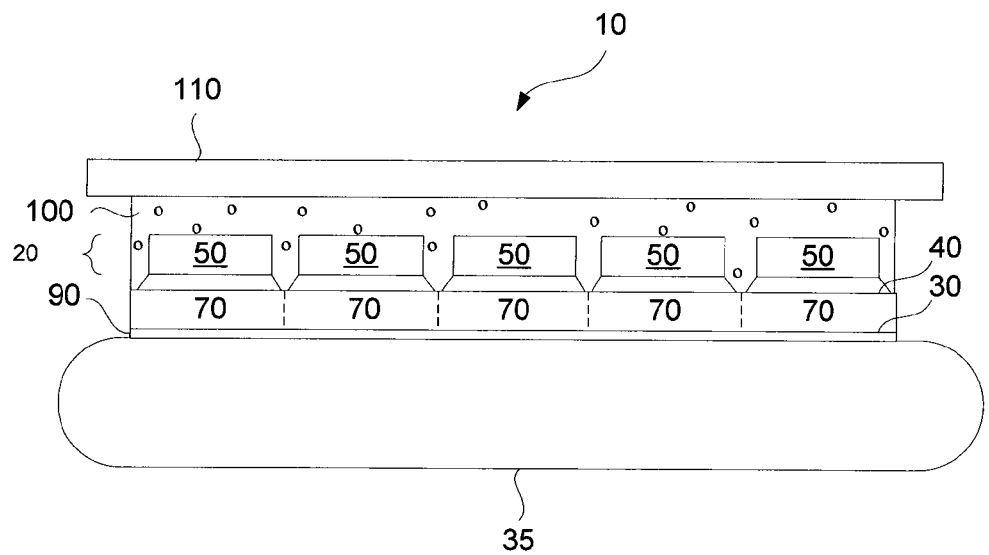

FIG. 2A shows integrated circuit structure 10 undergoing a further process step where a support layer 100 is coated over the back surface 40 of wafer 15 and over the plurality of dies 20 to encapsulate the back surface 40 of wafer 15 and the dies 20. Support layer 100 supports the wafer during handling or during a process step, such as wafer dicing and maybe removed following the process step. Support layer 100 may be formed of a material such as, for example PEG (polyethylene glycol), wax, polymer, or a polymer-based material, or a combination thereof. In one embodiment, the support layer 100 is a polymer having a molecular weight of 1500 and a melting temperature of more than 45° C. Support layer 100 may be applied to integrated circuit structure 10 by conventional methods such as spin coating, printing, or future-developed processes and preferably achieves a planar top surface. Support layer 100 may be formed on wafer 15 to a thickness greater than the height of dies 20 so as to encapsulate dies 20. A conventional CMP (chemical mechanical planarization) process may optionally be performed on integrated circuit structure 10 to planarize the top surface of support layer 100 and/or polish the support layer 100 to a desired thickness.

Figure 3A:
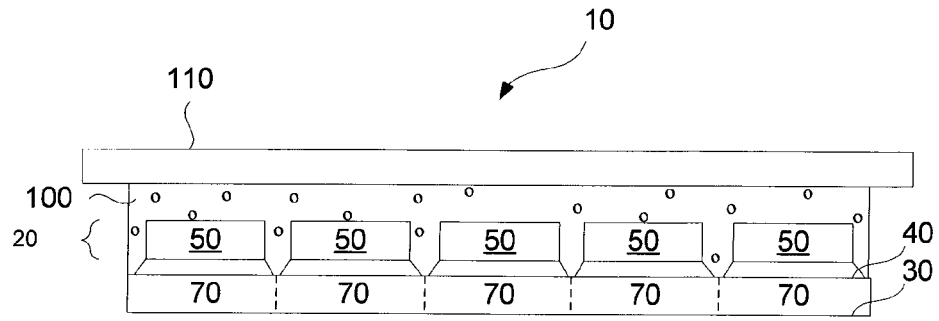
Figure 4A:
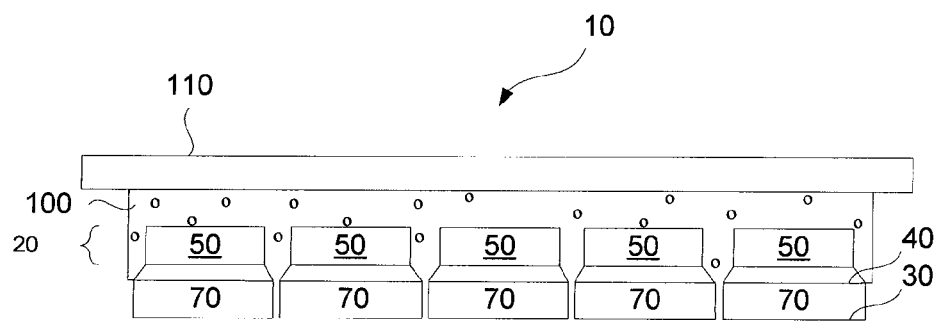
Figure 5A:
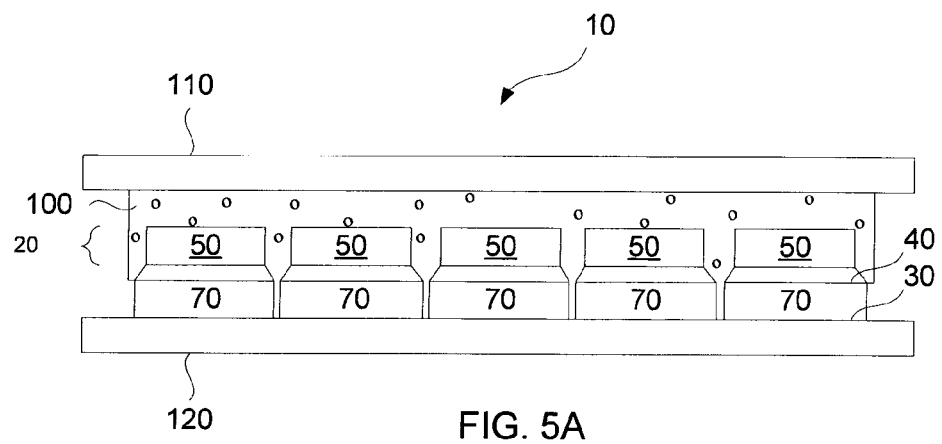
Figure 3B:
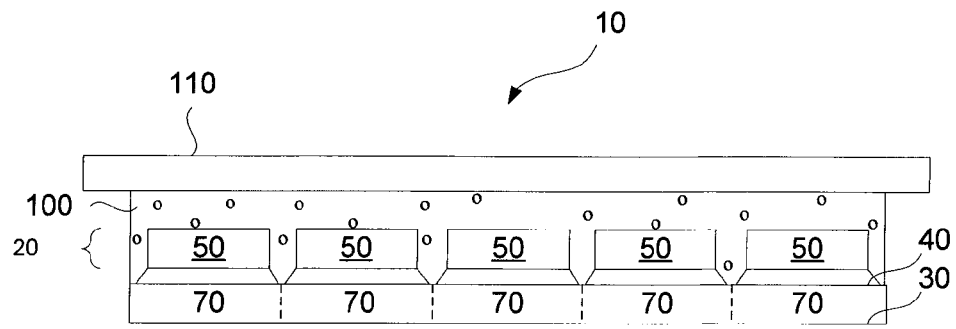
Figure 4B:
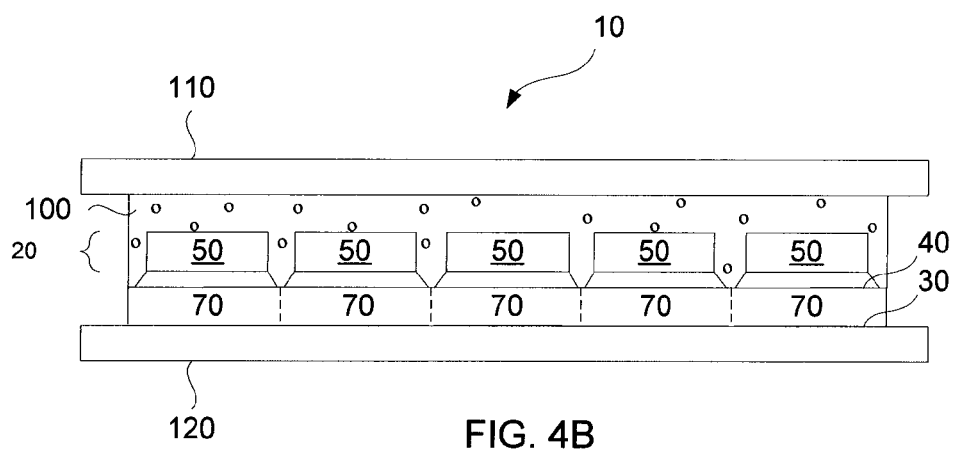
Figure 5B:
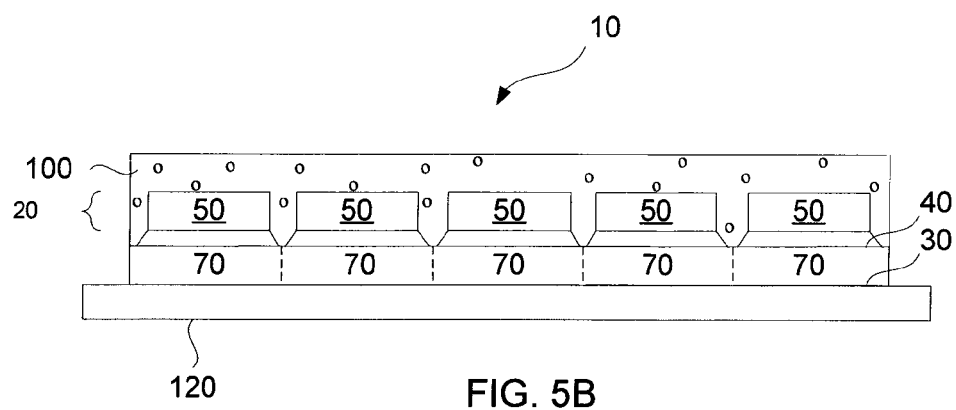
Figure 6A:
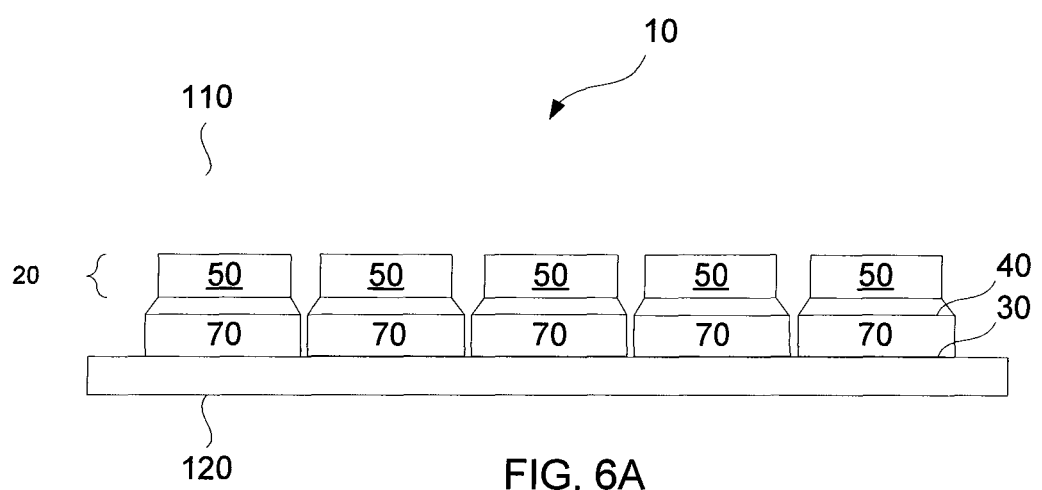

Following the formation of the planarized support layer 100, a first adhesion tape 110 is affixed to the support layer 100. The adhesion tape 110 may be a dicing tape or an ultraviolet tape. Following removal of the wafer carrier 35 as shown in FIG. 3A, in FIG. 4A, with the integrated circuit structure 10 affixed to the adhesion tape 110, wafer 15 undergoes a conventional dicing process to separate the wafer 15 into individual parts. In order to remove the separated individual parts for later packaging as individual semiconductor packages, the support layer 100 and the adhesion tape 110 will need to be removed. FIG. 5A shows a second adhesion tape 120 attached to the second side 30 of wafer 15. The second adhesion tape 120 may include a dicing tape or an ultraviolet tape. The first adhesion tape 110 and the support layer 100 are thereafter removed as shown in FIG. 6A. Support layer 100 may be removed by applying heat to the support layer 100 in excess of its melting temperature and the melted support layer 100 may be removed away in a spinning tool or wet batch tool, for example. Where the support layer 100 is formed by PEG, for example, heating the support layer 100 to a temperature of 45° C. or greater melts the support layer 100. The heating apparatus may include heating plates and heating lamps. Following the removal of the second adhesion tape 120, the separated individual parts can then be packaged as individual semiconductor packages for bonding to a substrate such as a printed circuit board (PCB).

Figure 1B:
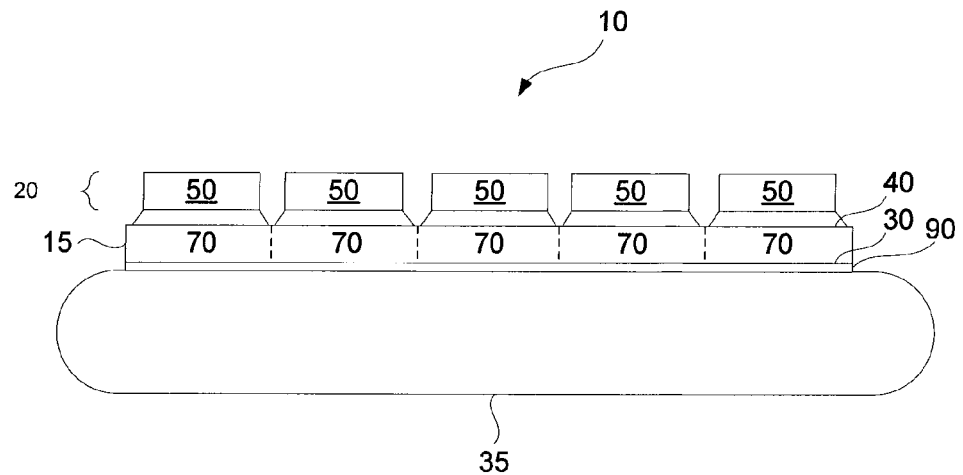
Figure 2B:
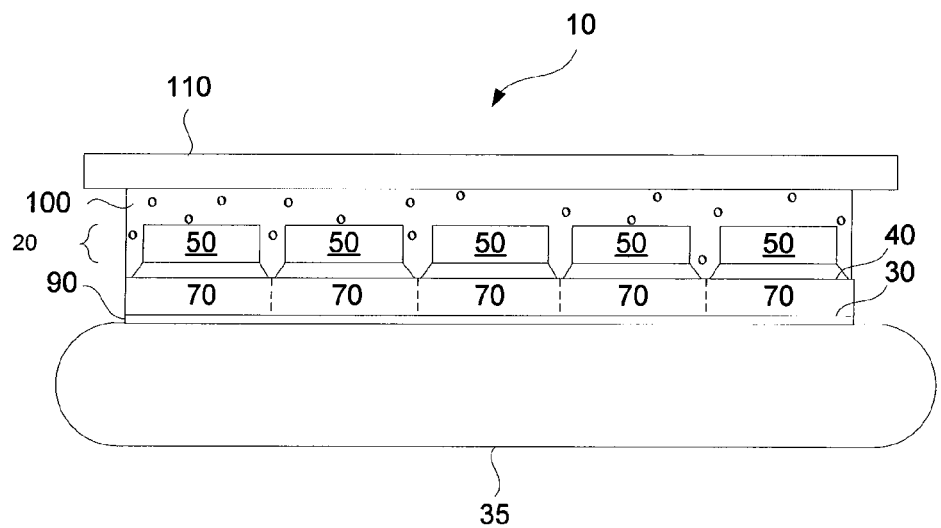
Figure 6B:
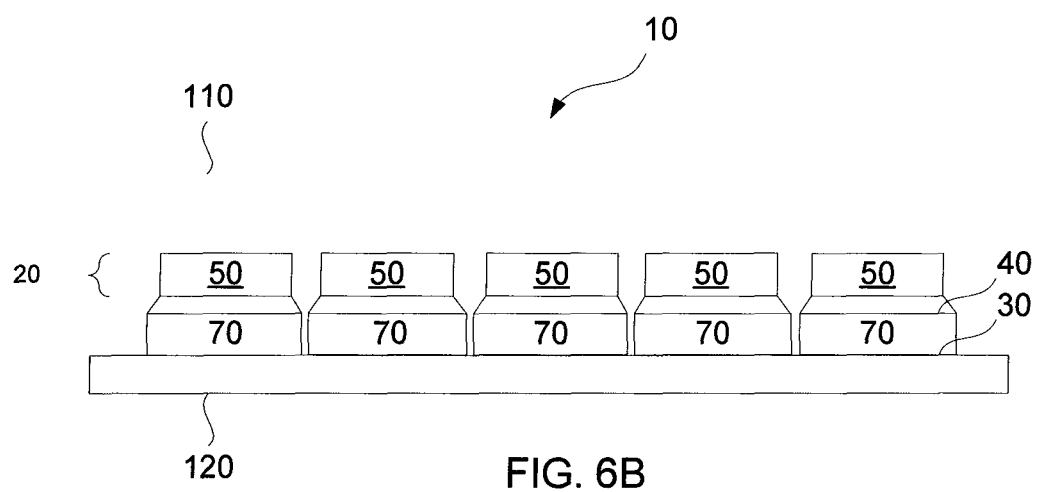

FIGS. 1B-6B are cross-sectional views depicting a semiconductor device undergoing various fabrication stages according to another embodiment of the present invention. The steps shown in FIGS. 1B, 2B, and 3B are the same as described above with respects to FIGS. 1A, 2A, and 3A and therefore will not be described again. In FIG. 4B, a second adhesion tape 120 is attached to the second side 30 of wafer 15 following the removal of the wafer carrier 35. The second adhesion tape 120 may include a dicing tape or an ultraviolet tape. FIG. 5B shows the removal of the first adhesion tape 110. The support layer 100 is removed and then wafer 15 is then diced in the usual manner to separate the wafer into individual parts, as shown in FIG. 6B. Support layer 100 may be removed by applying heat thereto in excess of its melting temperature and the melted support layer 100 may be removed away in a spinning tool or wet batch tool. Following the removal of the second adhesion tape 120, the separated individual parts can then be packaged as individual semiconductor packages for bonding to a substrate such as a printed circuit board (PCB).

Embodiments of the above methods for ultra thin wafer handling and processing have been described that yields high wafer throughput with low wafer breakage rate as compared to other prior art methods.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A thin wafer protection device, comprising:
   a wafer having a plurality of semiconductor chips, the wafer having a first side and an opposite second side;
   a plurality of dies over the first side of the wafer, wherein at least one of the plurality of dies is bonded to at least one of the plurality of semiconductor chips;
   a wafer carrier over the second side of the wafer;
   an encapsulating layer over the first side of the wafer and the plurality of dies, wherein the encapsulating layer has a planar top surface; and
   an adhesive tape over the planar top surface.

2. The thin wafer protection device of claim 1, further comprising at least one redistribution layer between the plurality of dies and the plurality of semiconductor chips.

3. The thin wafer protection device of claim 1, wherein the plurality of chips comprise radio frequency chips or logic chips.

4. The thin wafer protection device of claim 1, wherein the plurality of dies comprise memory chips, radio frequency chips or logic chips.

5. The thin wafer protection device of claim 1, wherein at least one of the plurality of dies is bonded to more than one of the plurality of semiconductor chips.

6. The thin wafer protection device of claim 1, wherein the encapsulating layer comprises polyethylene glycol, a wax, a polymer, a polymer-based material, or a combination thereof.

7. The thin wafer protection device of claim 1, wherein the encapsulating layer comprise a molecular weight of 1500 and a melting temperature greater than 45° C.

8. The thin wafer protection device of claim 1, wherein the adhesive tape comprises dicing tape or ultraviolet tape.

9. The thin wafer protection device of claim 1, further comprising through silicon vias (TSVs) arranged to electrically connect the wafer to the plurality of dies.

10. The thin wafer protection device of claim 1, further comprising a bonding structure between the at least one of the plurality of dies and the at least one of the plurality of semiconductor chips, wherein the bonding structure comprises a solder bump or a copper post.

11. The thin wafer protection device of claim 1, wherein the adhesive tape comprises dicing tape or ultraviolet tape.

12. A thin wafer protection device, comprising:
    a wafer having a plurality of semiconductor chips, the wafer having a first side and an opposite second side;
    a plurality of dies over the first side of the wafer, wherein at least one of the plurality of dies is bonded to at least one of the plurality of semiconductor chips;
    an adhesive tape over the second side of the wafer; and
    an encapsulating layer over the first side of the wafer and the plurality of dies, wherein the encapsulating layer has a planar top surface.

13. The thin wafer protection device of claim 12, further comprising at least one redistribution layer between the plurality of dies and the plurality of semiconductor chips.

14. The thin wafer protection device of claim 12, wherein the plurality of chips comprise radio frequency chips or logic chips.

15. The thin wafer protection device of claim 12, wherein the plurality of dies comprise memory chips, radio frequency chips or logic chips.

16. The thin wafer protection device of claim 12, wherein at least one of the plurality of dies is bonded to more than one of the plurality of semiconductor chips.

17. The thin wafer protection device of claim 12, wherein the encapsulating layer comprises polyethylene glycol, a wax, a polymer, a polymer-based material, or a combination thereof.

18. The thin wafer protection device of claim 12, wherein the encapsulating layer comprise a molecular weight of 1500 and a melting temperature greater than 45° C.

19. A thin wafer protection device, comprising:
   a wafer having a plurality of semiconductor chips, the wafer having a first side and an opposite second side;
   a plurality of dies over the first side of the wafer, wherein at least one of the plurality of dies is bonded to at least one of the plurality of semiconductor chips; and
   an adhesive tape over the second side of the wafer.

20. The thin wafer protection device of claim 19, further comprising through silicon vias (TSVs) arranged to electrically connect the wafer to the plurality of dies.

* * * * *